United States Patent
Yamaguchi et al.

(10) Patent No.: US 9,613,720 B2
(45) Date of Patent: Apr. 4, 2017

(54) SEMICONDUCTOR STORAGE DEVICE

(71) Applicant: Kabushiki Kaisha Toshiba, Minato-ku (JP)

(72) Inventors: Kouichirou Yamaguchi, Kawasaki (JP); Makoto Miakashi, Kawasaki (JP); Hitoshi Shiga, Kawasaki (JP); Noboru Shibata, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/059,477

(22) Filed: Mar. 3, 2016

(65) Prior Publication Data
US 2016/0189801 A1    Jun. 30, 2016

Related U.S. Application Data

(63) Continuation of application No. PCT/JP2013/073812, filed on Sep. 4, 2013.

(51) Int. Cl.
G11C 29/00 (2006.01)
G11C 29/02 (2006.01)
(Continued)

(52) U.S. Cl.
CPC ............ *G11C 29/76* (2013.01); *G11C 11/406* (2013.01); *G11C 29/021* (2013.01);
(Continued)

(58) Field of Classification Search
CPC .................................................. G11C 29/00
(Continued)

(56) References Cited

U.S. PATENT DOCUMENTS 5,862,086 A * 1/1999 Makimura ........... G11C 29/785
                                                365/189.07
6,567,322 B1 * 5/2003 Mukai ................... G11C 29/81
                                                365/200
(Continued)

FOREIGN PATENT DOCUMENTS

JP    2001-273798    10/2001
JP    2003-132693    5/2003
(Continued)

OTHER PUBLICATIONS

Office Action issued Jun. 17, 2016 in Singaporean Patent Application No. 11201601627X.
(Continued)

*Primary Examiner* — Harry W Byrne
(74) *Attorney, Agent, or Firm* — Oblon, McClelland, Maier & Neustadt, L.L.P.

(57) ABSTRACT

A semiconductor storage device has a memory cell array, a plurality of word lines, a plurality of bit lines, and a plurality of blocks including a group of at least some memory cells, a defect information storage block that stores defect information in the memory cell array, a first defect detection circuitry that reads data of at least some memory cells in the defect information storage block, verifies the data, and determines whether there is a defect in the defect information storage block, a second defect detection circuitry that changes a read voltage level for reading the data of the memory cells, rereads data of at least some memory cells in the defect information storage block, verifies the data, and determines whether there is the defect in the defect information storage block, and a defect determination circuitry that determines the defect information storage block as a defective block.

20 Claims, 11 Drawing Sheets

(51) Int. Cl.
  *G11C 29/24*  (2006.01)
  *G11C 11/406*  (2006.01)
  *G11C 16/00*  (2006.01)
  *G11C 16/34*  (2006.01)
  *G11C 29/44*  (2006.01)

(52) U.S. Cl.
  CPC ............ *G11C 29/028* (2013.01); *G11C 29/24* (2013.01); *G11C 16/00* (2013.01); *G11C 16/349* (2013.01); *G11C 2029/4402* (2013.01)

(58) Field of Classification Search
  USPC ........................................ 365/189.011–225.7
  See application file for complete search history.

(56) References Cited

U.S. PATENT DOCUMENTS

| | | | | |
|---|---|---|---|---|
| 6,819,607 | B2* | 11/2004 | Mukai | .................... G11C 29/81 365/200 |
| 2003/0081478 | A1 | 5/2003 | Sugita | |
| 2003/0112675 | A1* | 6/2003 | Mukai | .................. G11C 29/785 365/200 |
| 2008/0151661 | A1 | 6/2008 | Takai | |
| 2011/0271036 | A1 | 11/2011 | Cheng et al. | |

FOREIGN PATENT DOCUMENTS

| | | |
|---|---|---|
| JP | 2003-187599 | 7/2003 |
| JP | 2004-118407 | 4/2004 |
| JP | 2006-114078 | 4/2006 |
| JP | 2008-159185 | 7/2008 |
| JP | 2013-73669 | 4/2013 |

OTHER PUBLICATIONS

English Translation of International Search Report issued Dec. 17, 2013 in PCT/JP2013/073812, filed Sep. 4, 2013.

* cited by examiner

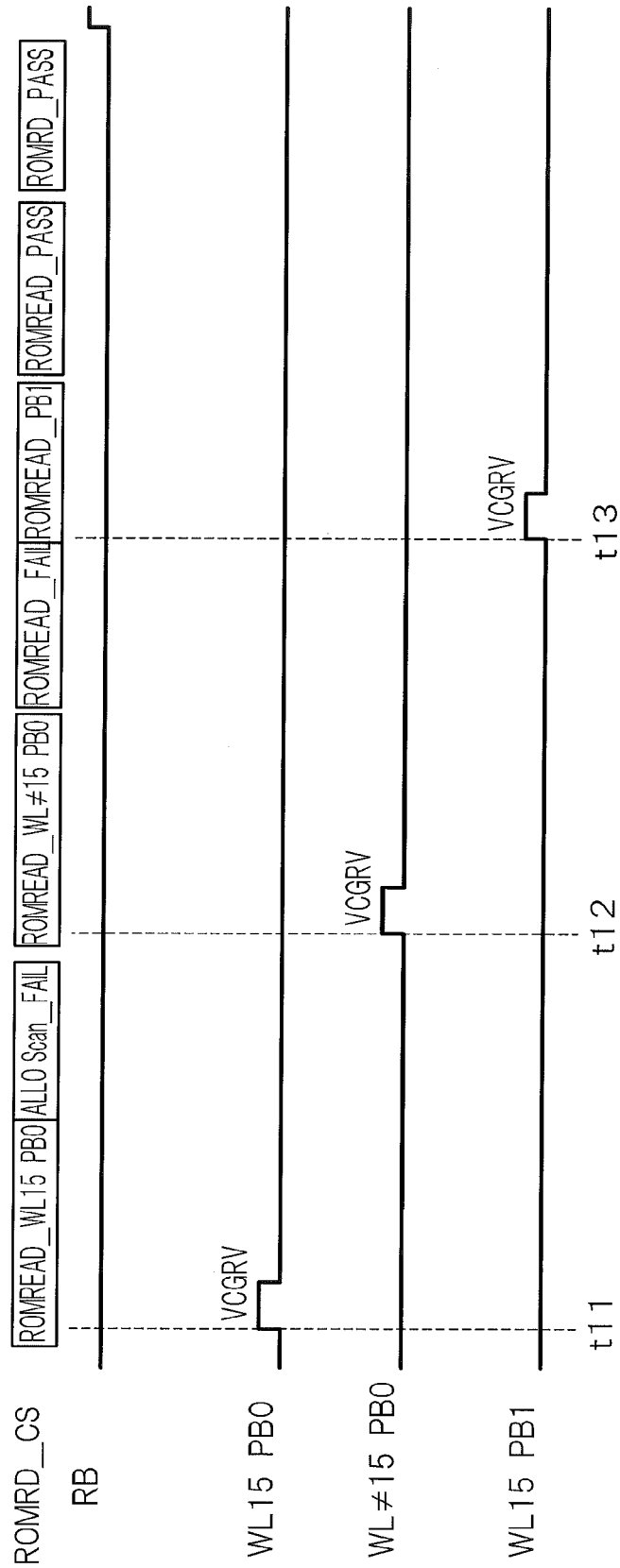
F I G. 7

FIG. 9A

| IO | IO 7 | IO 6 | IO 5 | IO 4 | IO 3 | IO 2 | IO 1 | IO 0 |
|---|---|---|---|---|---|---|---|---|
| Data Latch 0 | Block Add X[7] | Block Add X[6] | Block Add X[5] | Block Add X[4] | Block Add X[3] | Block Add X[2] | Block Add X[1] | Block Add X[0] |
| Data Latch 1 | /Block Add X[7] | /Block Add X[6] | /Block Add X[5] | /Block Add X[4] | /Block Add X[3] | /Block Add X[2] | /Block Add X[1] | /Block Add X[0] |
| Data Latch 2 | Block IO [7] | Block IO [6] | Block IO [5] | Block IO [4] | Block IO [3] | Block IO [2] | Block IO [1] | Block IO [0] |
| Data Latch 3 | /Block IO [7] | /Block IO [6] | /Block IO [5] | /Block IO [4] | /Block IO [3] | /Block IO [2] | /Block IO [1] | /Block IO [0] |

Block Add X = QUOTIENT OBTAINED BY DIVIDING BLOCK ADDRESS BY 8
Block IO = ALLOCATE 8 BLOCKS OF BLOCK X TO INDIVIDUAL BITS

|  | Block Add X | Block IO |
|---|---|---|
| Block 0 | b'0000_0000 | b'0000_0001 |
| Block 1 | b'0000_0000 | b'0000_0010 |
| Block 2 | b'0000_0000 | b'0000_0100 |
| Block 3 | b'0000_0000 | b'0000_1000 |
| Block 4 | b'0000_0000 | b'0001_0000 |
| Block 5 | b'0000_0000 | b'0010_0000 |
| Block 6 | b'0000_0000 | b'0100_0000 |
| Block 7 | b'0000_0000 | b'1000_0000 |
| Block 8 | b'0000_0001 | b'0000_0001 |
| Block 9 | b'0000_0001 | b'0000_0010 |
| Block 10 | b'0000_0001 | b'0000_0100 |
| Block 11 | b'0000_0001 | b'0000_1000 |
| Block 12 | b'0000_0001 | b'0001_0000 |
| Block 13 | b'0000_0001 | b'0010_0000 |
| Block 14 | b'0000_0001 | b'0100_0000 |
| Block 15 | b'0000_0001 | b'1000_0000 |

FIG. 9B

| Block 16 | b'0000_0010 | b'0000_0001 |
|---|---|---|
| Block 17 | b'0000_0010 | b'0000_0010 |
| Block 18 | b'0000_0010 | b'0000_0100 |
| Block 19 | b'0000_0010 | b'0000_1000 |
| ... | ... | ... |
| Block 24 | b'0000_0011 | b'0000_0001 |
| Block 25 | b'0000_0011 | b'0000_0010 |
| Block 26 | b'0000_0011 | b'0000_0100 |
| Block 27 | b'0000_0011 | b'0000_1000 |
| ... | ... | ... |

SEMICONDUCTOR STORAGE DEVICE

CROSS REFERENCE TO RELATED APPLICATIONS

This application is based upon and claims the benefit of priority from the prior PCT Application No. PCT/JP2013/073812, filed on Sep. 4, 2013, the entire contents of which are incorporated herein by reference.

FIELD

Embodiments of the present invention relate to a semiconductor storage device that can store defect information.

BACKGROUND

A ROM FUSE block to store defect information of memory cells in a block unit or a column unit may be provided in a memory cell array.

The ROM FUSE block has a size equal to a size of a normal block and includes a plurality of memory cells. When a defect beyond an allowable limit occurs in the memory cells of the ROM FUSE block, ROM FUSE data itself stored in the ROM FUSE block may become defective. In addition, when a defect occurs in the ROM FUSE data, it takes time to correct an error, which may result in decreasing an operation speed of a semiconductor storage device. Particularly, when the memory cells are miniaturized, the memory cells are likely to become defective. For this reason, a defect check of the ROM FUSE block becomes important.

The defect check of the ROM FUSE block is generally executed during a power-on read period after power is supplied.

However, when the memory cells are miniaturized, an erasure level is likely to change, a difference of the erasure level and a read level decreases, and erroneous read is more likely to occur.

If the memory cell is miniaturized and a memory capacity increases, the number of blocks also increases and defect information to be recorded in the ROM FUSE block also increases. For this reason, it takes time to read the defect information from the ROM FUSE block.

BRIEF DESCRIPTION OF THE DRAWINGS

FIG. 7 is a timing diagram illustrating process timing of steps S31 to S38 of FIG. 6;

FIG. 9A is a diagram illustrating a data configuration of bad block information stored in each data area of the ROM FUSE block 31;

FIG. 9B is a diagram illustrating a correspondence relation of a quotient Block Add X and 8-bit data Block IO;

DETAILED DESCRIPTION OF THE INVENTION

According to one embodiment, a semiconductor storage device has:

a memory cell array that has a plurality of memory cells, a plurality of word lines connected to at least some memory cells of the plurality of memory cells, a plurality of bit lines connected to at least some memory cells of the plurality of memory cells, and a plurality of blocks including a group of at least some memory cells of the plurality of memory cells;

a defect information storage block that is at least one of the plurality of blocks and stores defect information in the memory cell array;

a first defect detection circuitry that reads data of at least some memory cells in the defect information storage block, verifies the data, and determines whether there is a defect in the defect information storage block;

a second defect detection circuitry that, when it is determined by the first defect detection circuitry that there is the defect, changes a read voltage level for reading the data of the memory cells, rereads data of at least some memory cells in the defect information storage block, verifies the data, and determines whether there is the defect in the defect information storage block; and a defect determination circuitry that, when it is determined by the second defect detection circuitry that there is the defect, determines the defect information storage block as a defective block.

Hereinafter, embodiments of the present invention will be described with reference to the drawings.

First Embodiment

Figure 1:
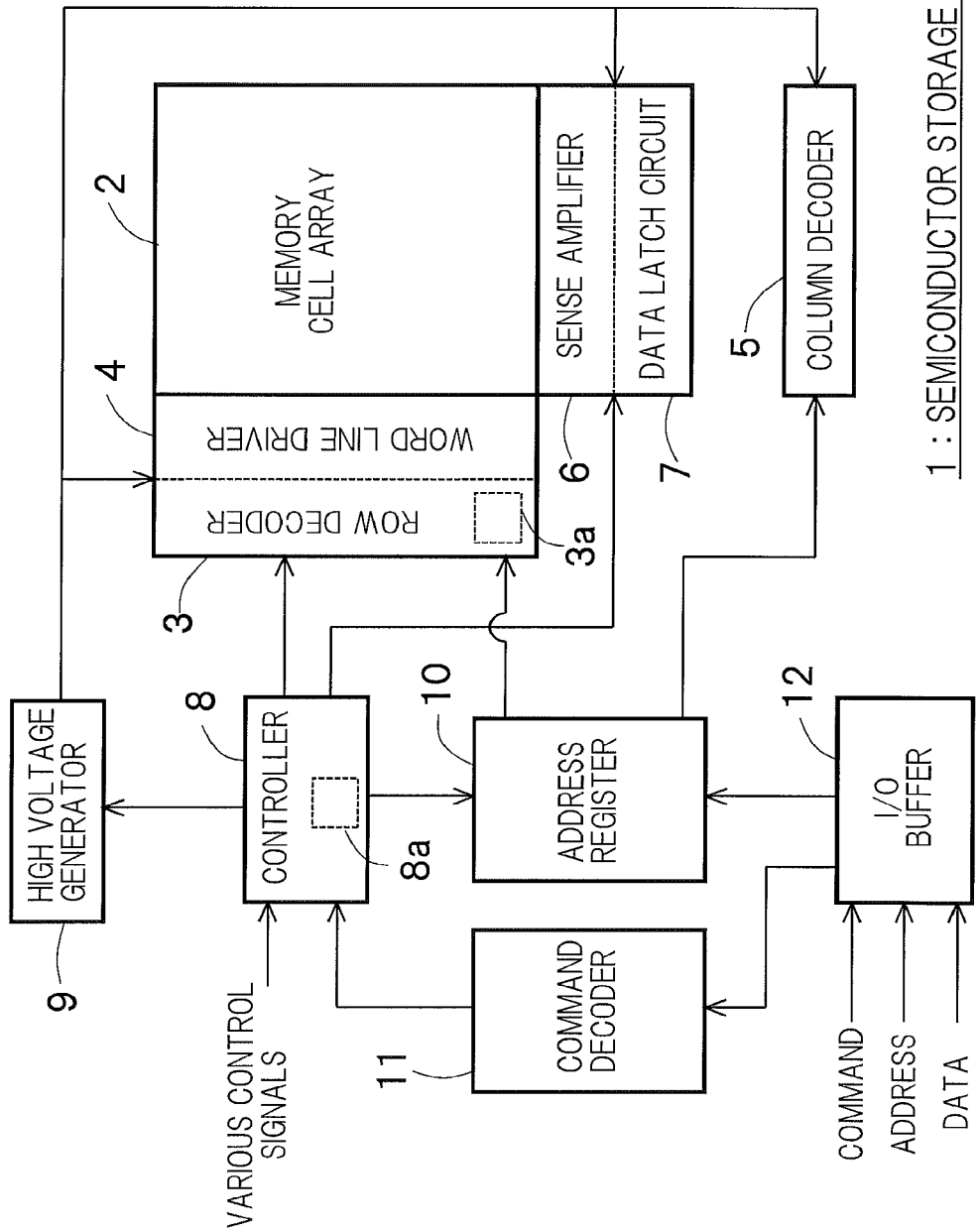
FIG. 1 is a block diagram illustrating a schematic configuration of a semiconductor storage device 1 according to a first embodiment.

FIG. 1 is a block diagram illustrating a schematic configuration of a semiconductor storage device 1 according to a first embodiment. The semiconductor storage device 1 of FIG. 1 is an example of a NAND-type flash memory.

The semiconductor storage device 1 of FIG. 1 includes a memory cell array 2, a row decoder 3, a word line driver 4, a column decoder 5, a sense amplifier (S/A) 6, a data latch circuit 7, a controller 8, a high voltage generator 9, an address register 10, a command decoder 11, and an I/O buffer 12.

Figure 2:
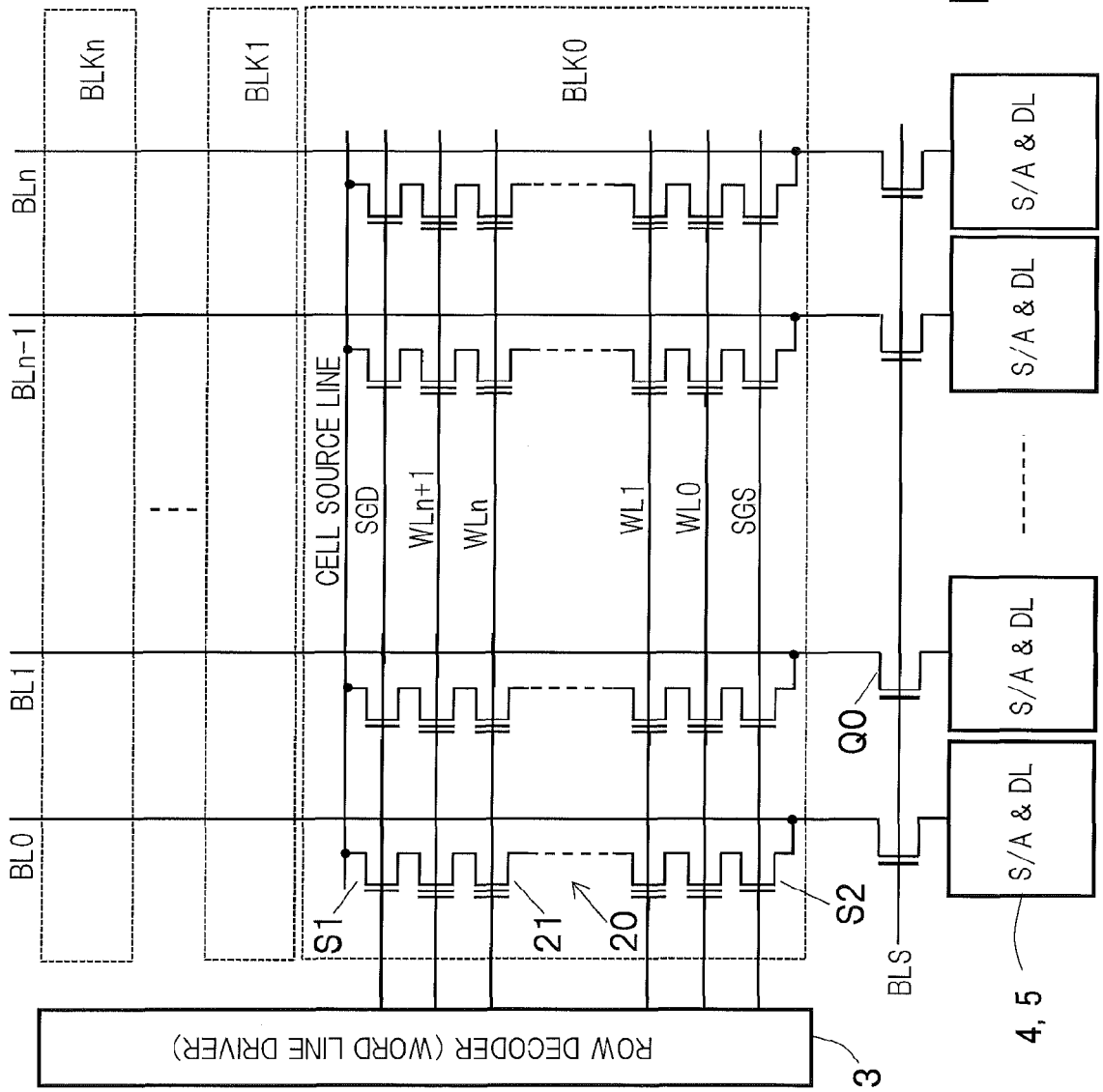
FIG. 2 is a block diagram illustrating a detailed configuration of a peripheral portion of a memory cell array 2.

The memory cell array 2 has NAND strings 20 that are obtained by connecting a plurality of memory cells in series. FIG. 2 is a block diagram illustrating a detailed configuration of a peripheral portion of the memory cell array 2. As illustrated in FIG. 2, the memory cell array 2 is divided into a plurality of blocks BLK0 to BLKn. In each block, the plurality of NAND strings 20 are arranged in a column direction. Each NAND string 20 has a plurality of memory cells 21 that are connected in series, a selection gate transistor S1 that is connected to one end side of the memory cell 21, and a selection gate transistor S2 that is connected to the other end side.

Gates of the individual memory cells 21 in the NAND string 20 are connected to corresponding word lines WL0 to WLn+1 (n is an integer of 0 or more). A gate of the selection gate transistor S1 is connected to a selection gate line SGD. A gate of the selection gate transistor S2 is connected to a selection gate line SGS. The individual NAND strings 20 are connected to a common cell source line via the corresponding selection gate transistors S1. In addition, the individual NAND strings 20 are connected to corresponding bit lines BL0 to BLn via the corresponding selection gate transistors S2.

The individual word lines WL0 to WLn+1 connected to the gates of the individual memory cells 21 in the NAND string 20 are connected to the row decoder 3. The row decoder 3 decodes a row address transferred from the address register 10. The word line driver 4 is disposed in the vicinity of the row decoder 3. The word line driver 4 generates a voltage to drive each word line, on the basis of decoded data.

The bit lines BL0 to BLn connected to the individual NAND strings 20 are connected to the sense amplifiers 6 via bit line selection transistors Q0. Read data detected by the sense amplifier 6 is held as binary data in the data latch circuit 7.

The column decoder 5 illustrated in FIG. 1 decodes a column address from the address register 10. In addition, the column decoder 5 determines whether the data held in the data latch circuit 7 is transferred to a data bus, on the basis of a decoding result.

The I/O buffer 12 buffers an address, data, and a command input from an I/O terminal. In addition, the I/O buffer 12 transfers the address to the address register 10, transfers the command to the command decoder 11, and transfers the data to the data bus.

The controller 8 identifies the address and the command and controls a defect check of a ROM FUSE block to be described below or an operation of the sense amplifier 6.

As illustrated in FIG. 2, the memory cell array is divided into the plurality of blocks. However, two blocks among the plurality of blocks are a ROM FUSE block (defect information storage block) and a spare ROM FUSE block (spare storage block). In the ROM FUSE block and the spare ROM FUSE block, defect information in the memory cell array is stored. The spare ROM FUSE block is used when the ROM FUSE block becomes defective. When new defect information is stored in the ROM FUSE block, the same defect information is stored in the spare ROM FUSE block. By setting, it can be switched whether the spare ROM FUSE block is used.

The defect information stored in the ROM FUSE block and the spare ROM FUSE block is bad block information showing whether each block in the memory cell array is defective or bad column information showing whether each column in the memory cell array is defective. In addition, parameter information to adjust a voltage level of an internal voltage may be stored in the ROM FUSE block.

Figure 3:
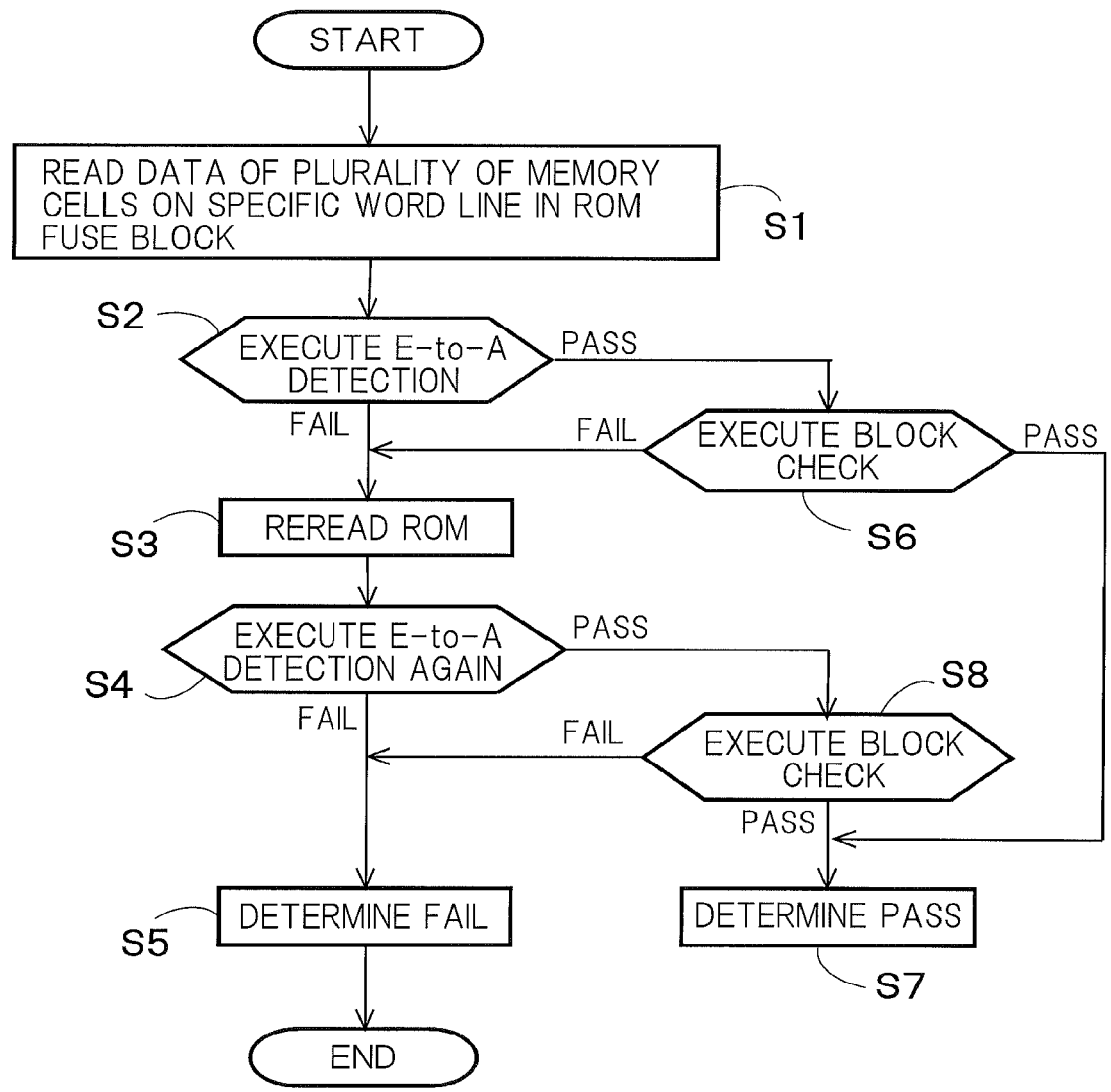
FIG. 3 is a flowchart illustrating a defect check process of a ROM FUSE block according to the first embodiment.

The controller 8 of FIG. 1 executes a process for checking whether there is a defect in the ROM FUSE block at the time of a power-on read (POR) operation. FIG. 3 is a flowchart illustrating a defect check process of the ROM FUSE block according to the first embodiment.

As write methods to the memory cell in the NAND-type flash memory, there are methods corresponding to both a single level cell (SLC) method and a multi-level cell (MLC) method. In this embodiment, SLC is adopted. This is because MLC executes multivalued write, a read margin is small, and erroneous read is likely to occur. Therefore, the defect check of the ROM FUSE block is executed using SLC enabling high-reliability read.

First, data stored in a plurality of memory cells on a specific word line among a plurality of word lines in the ROM FUSE block is read (step S1). The specific word line may be basically any word line. However, a word line to read data with high reliability among the plurality of word lines in the ROM FUSE block is preferably set as the specific word line. In the present specification, an example of the case in which the specific word line is set as a word line WL15 will be described.

Next, a check (hereinafter, referred to as E-to-A detection) on whether normal read is disabled due to a shift of a threshold voltage distribution of an erasure level of the memory cell in a direction of a threshold voltage distribution of an A level close to the erasure level is executed using the data read by step S1 (step S2). Steps S1 and S2 described above correspond to a first defect detection unit (first defect detection circuitry).

Three methods (E-to-A detection methods 1 to 3) to be described below are considered as a specific method of the E-to-A detection and any method may be used.

Bit lines corresponding to 16 Kbytes are connected to each word line in the ROM FUSE block. These bit lines are divided in segments for every bit lines corresponding to 2 Kbytes. In the E-to-A detection, a read check of the memory cells is executed using a non-used segment among the segments.

In the E-to-A detection method 1, in a state in which all memory cells of the non-used segment are erased, all of the memory cells of the non-used segment are read. If the number of data read as data "0" instead of data "1" to be an erasure state is more than a predetermined value, it is determined that the E-to-A detection has failed in.

In the E-to-A detection method 2, in a state in which all memory cells on a specific bit line in the non-used segment in the ROM FUSE block are erased, all of the memory cells are read. If the number of data read as data "0" is more than the predetermined value, it is determined that the E-to-A detection has failed in.

In the E-to-A detection method 3, complementary data is written to the memory cells of the non-used segment in the ROM FUSE block. If the written complementary data is read and the number of changes of bit logic of the complementary data is more than a predetermined value, it is determined that the E-to-A detection has failed in.

When the E-to-A detection of step S2 executed by any one of the E-to-A detection methods 1 to 3 has failed in, it is determined that the threshold voltage distribution of the E level has been shifted in the direction of the threshold voltage distribution of the A level, a read voltage level for reading the memory cells is increased, and reread (hereinafter, referred to as ROM reread) from the memory cells is executed (step S3). In the ROM reread, a voltage applied between a gate and a source of the memory cell is increased and the reread from the memory cell is executed.

Next, the E-to-A detection is executed again using the data read by step S3 (step S4). In this case, in the E-to-A detection, any one of the detection methods 1 to 3 may be adopted. Steps S3 and S4 described above correspond to a second defect detection unit (second defect detection circuitry).

If the E-to-A detection of step S4 is failed in, it is determined that the check of the ROM FUSE block has failed in (step S5: defect determination unit or defect determination circuitry). In this case, the NAND-type flash memory including the ROM FUSE block is assumed as a defective product.

Meanwhile, when the E-to-A detection of step S2 has passed in, a block check executed by a normal power-on read operation is executed (step S6: third defect detection unit or third defect detection circuitry). In the block check, for example, when bad block information or bad column information is stored in the ROM FUSE block, the bad block information or the bad column information is stored as the complementary data, the stored complementary data is read, two kinds of data configuring the complementary data are compared in a bit unit, and it is determined whether there is a read error. The block check does not need to be executed on all memory cells in the ROM FUSE block and may be executed on only the memory cells on the specific word line.

When the block check of step S6 has failed in, the ROM reread of step S3 is executed and when the block check has passed in, it is determined that the ROM FUSE block is normal (step S7).

Likewise, even when the E-to-A detection of step S4 has passed in, the block check is executed (step S8: third defect detection unit or third defect detection circuitry). When the block check has failed in, a fail is determined (step S5) and when the block check has passed in, it is determined that the check of the ROM FUSE block has passed in (step S7).

In the flowchart of FIG. 3, the example of the case in which the E-to-A detection and the ROM reread in which the read voltage level has changed are combined has been described. However, only the ROM reread may be executed without executing the E-to-A detection. In this case, instead of the E-to-A detection of steps S2 and S4, an existing block check may be executed.

In addition, only the E-to-A detection may be executed without executing the ROM reread. In this case, it is determined whether the ROM FUSE block is normal, using a result of one E-to-A detection. For this reason, a level of defectiveness of the ROM FUSE block may increase. Therefore, when the level of defectiveness of the ROM FUSE block needs to be decreased, the ROM reread is preferably executed.

As such, in the first embodiment, when it is determined by the E-to-A detection or the block check that the ROM FUSE block is defective, the read voltage level is increased and it is predetermined whether the ROM FUSE block is defective. Therefore, even though the threshold voltage distribution of the E level of the memory cell is slightly shifted to the side of the threshold voltage distribution of the A level due to a manufacturing variation, it is not determined that the ROM FUSE block is defective and the level of defectiveness of the ROM FUSE block can be reduced.

Second Embodiment

In a second embodiment to be described below, when it is determined that a ROM FUSE block is defective, a refresh operation of the ROM FUSE block is executed.

A NAND-type flash memory according to the second embodiment includes the same block configuration as the block configuration of FIG. 1 and a process operation of a controller 8 is different from a process operation of the first embodiment. Therefore, the process operation of the controller 8 will be described hereinafter.

Figure 4:
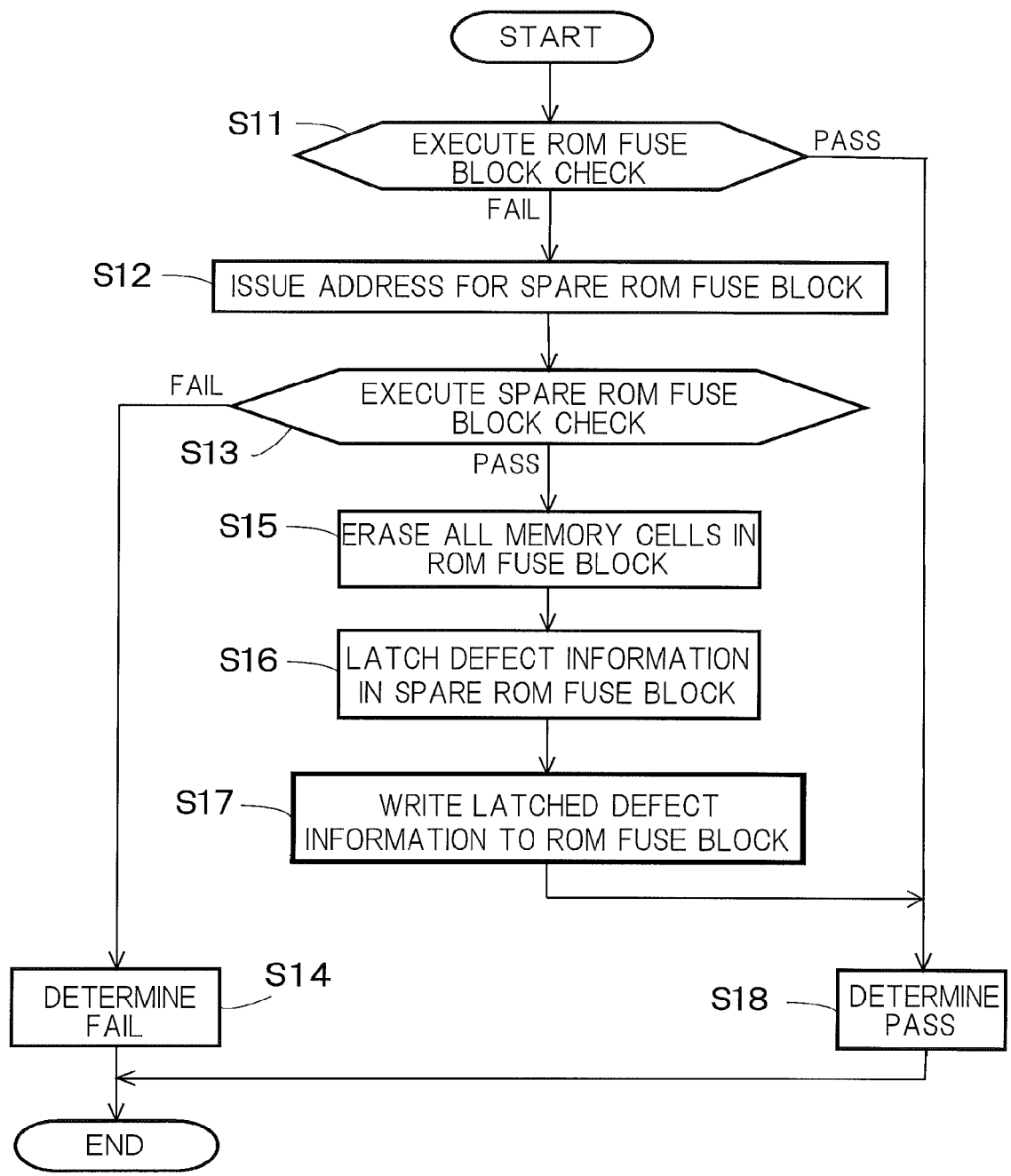
FIG. 4 is a flowchart illustrating a defect check process of a ROM FUSE block according to a second embodiment.

FIG. 4 is a flowchart illustrating a defect check process of the ROM FUSE block according to the second embodiment. First, a defect check of the ROM FUSE block is executed (step S11: first defect detection unit or first defect detection circuitry). In the defect check of step S11, for example, the existing block check is executed on memory cells on a specific word line in the ROM FUSE block. Alternatively, any one of the E-to-A detection methods 1 to 3 may be adopted.

When it is determined in step S11 that the ROM FUSE block is normal, it is determined that the check of the ROM FUSE block has passed in (step S19) and the process of FIG. 4 ends. In this case, the refresh operation of the ROM FUSE block is not executed.

Meanwhile, when it is determined in step S11 that the ROM FUSE block is defective, an address is issued to have access to a spare ROM FUSE block (step S12) and a defect check of the spare ROM FUSE block is executed (step S13: second defect detection unit or second defect detection circuitry).

When it is determined that the spare ROM FUSE block is defective, defect information in the spare ROM FUSE block cannot be effectively used. For this reason, it is determined that the refresh operation of the ROM FUSE block does not need to be executed and it is determined that the check of the ROM FUSE block has failed in (step S14). In this case, the NAND-type flash memory including the ROM FUSE block is assumed as a defective product.

When it is determined that the spare ROM FUSE block is normal, all memory cells in the ROM FUSE block are erased (step S15: data erasure unit or data erasure circuitry). As a result, data "1" is written to all of the memory cells in the ROM FUSE block.

After a process of step S15, entire defect information stored in the spare ROM FUSE block is latched temporarily by a data latch circuit 7 in a sense amplifier 6 (step S16: temporary storage).

Next, the defect information in the spare ROM FUSE block latched temporarily by step S16 is written to the ROM FUSE block (step S17: defect information write unit or defect information write circuitry). Steps S15 to S17 correspond to a refresh process unit or refresh process circuitry.

In the write of step S17, defect information may be written to memory cells on a word line determined as a defect by step S11 in the ROM FUSE block and the defect information may be written to memory cells on word lines other than the word line determined as the defect. When the defect occurs due to a structural failure in a specific memory cell, it is preferable that the memory cell be not used. However, when the defect occurs due to temporary read disturbance, rewriting to the memory cell having caused the defect may not cause a problem. Therefore, in this embodiment, rewriting to the memory cell determined as the defect is allowed.

If the refresh process of steps S15 to S17 ends, it is assumed that there is no defect in the ROM FUSE block and a pass is determined (step S18).

Figure 5:
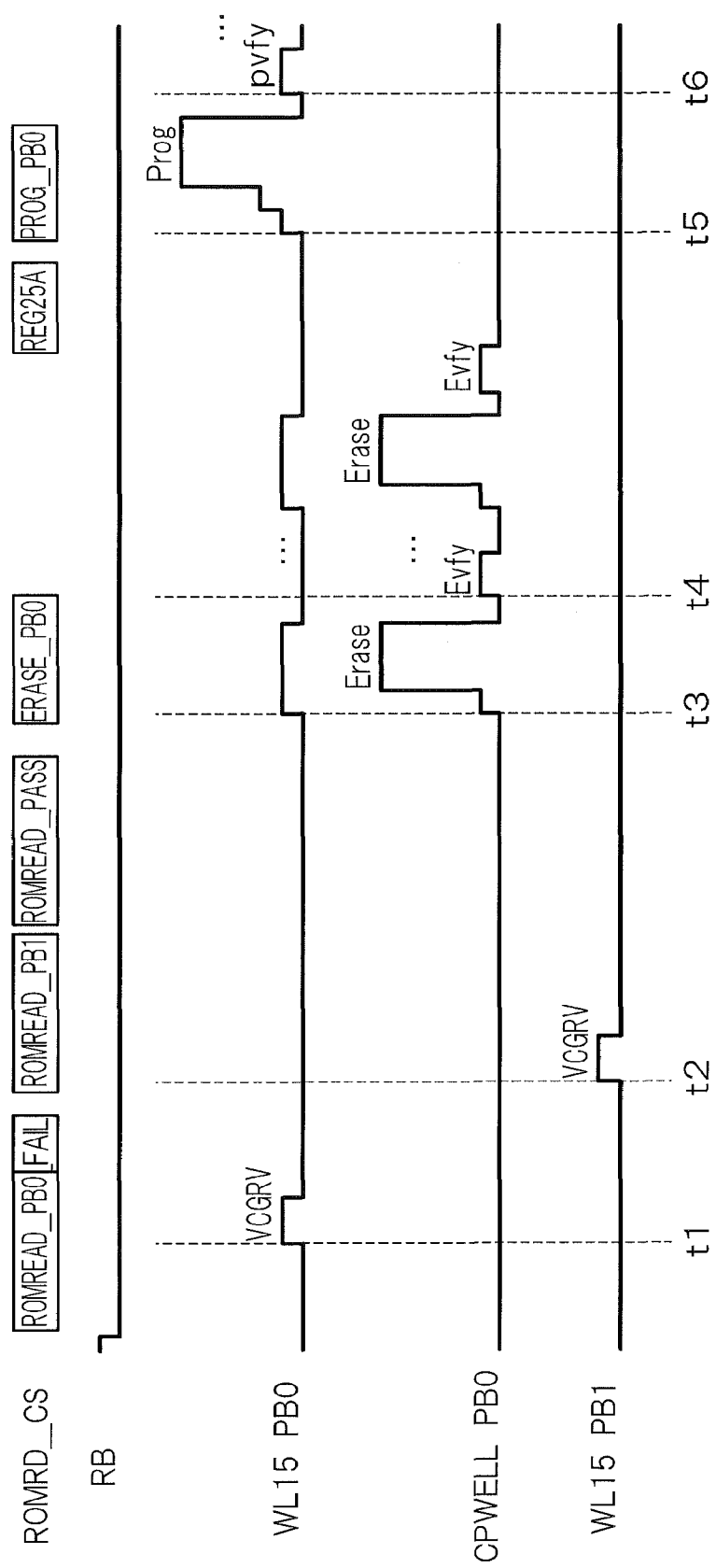
FIG. 5 is a timing diagram when defect information is rewritten at the time of a refresh operation.

FIG. 5 is a timing diagram when the defect information is rewritten to the memory cell determined as the defect in the past at the time of the refresh operation, in step S17 of FIG. 4. FIG. 5 illustrates signal waveforms of a ready/busy signal RB, a word line WL15 PB0 of the ROM FUSE block, a substrate well region CPWELL PB0 of a memory cell connected to the word line, and a word line WL15 PB1 of the spare ROM FUSE block.

A power-on read operation starts after the ready/busy signal RB changes from a high level to a low level and the refresh operation is executed during the power-on read operation. First, data is read from memory cells on a specific word line (for example, a word line WL15) in the ROM FUSE block (time t1). At the time t1, the word line WL15 of the ROM FUSE block is set to a read voltage VCGRV.

When it is determined by the read data that the ROM FUSE block is defective, data is read from memory cells on a specific word line (for example, a word line WL15) in the spare ROM FUSE block (time t2) and it is determined whether there is a defect in the spare ROM FUSE block.

When it is determined that the spare ROM FUSE block is normal, data of all memory cells in the ROM FUSE block determined as the defect is erased (time t3). The memory cells in which the data has been erased are verified and it is confirmed whether the data of the memory cells has been erased correctly (time t4). The data erasure and the verification of the memory cells in the ROM FUSE block are repeated until data erasure and verification for all of the memory cells in the ROM FUSE block end.

If the data erasure of the ROM FUSE block ends, the defect information from the spare ROM FUSE block is read and is held temporarily by the data latch circuit in the sense amplifier. Then, the held defect information is written to the ROM FUSE block (time t5). Next, it is verified whether the written defect information is normally read (time t6). The processes of the times t5 and t6 are continuously executed until the entire defect information in the spare ROM FUSE block is written to the ROM FUSE block.

Information showing whether the refresh operation of the ROM FUSE block has been executed may be stored in a register circuit 8a (refer to FIG. 1) in the controller 8. For example, the register circuit (refresh history information storage) 8a composed of a non-volatile memory such as an SRAM capable of storing data of at least one byte may be provided, the information showing whether the refresh operation of the ROM FUSE block has been executed may be stored in one bit of one byte, and the data of one byte of the register circuit 8a may be output to the outside according to a specific command from the outside. As a result, history information showing whether the refresh operation of the ROM FUSE block is executed in the past can be detected from the outside of the NAND-type flash memory and reliability of the ROM FUSE block can be evaluated by the history information.

As such, in the second embodiment, when it is determined that the ROM FUSE block is defective, the refresh operation to write the defect information in the spare ROM FUSE block after the data of all of the memory cells in the ROM FUSE block is erased is executed. Therefore, reliability of the defect information in the ROM FUSE block can be improved and a level of defectiveness of the ROM FUSE block can be decreased.

Third Embodiment

In a third embodiment to be described below, it is automatically determined whether a refresh operation of a ROM FUSE block is executed in the past and the refresh operation is not executed again on the ROM FUSE block on which the refresh operation is executed in the past.

A NAND-type flash memory according to the third embodiment includes the same block configuration as the block configuration of FIG. 1 and a process operation of a controller 8 is different from the process operations of the first and the second embodiments. Therefore, the process operation of the controller 8 will be described hereinafter.

Figure 6:
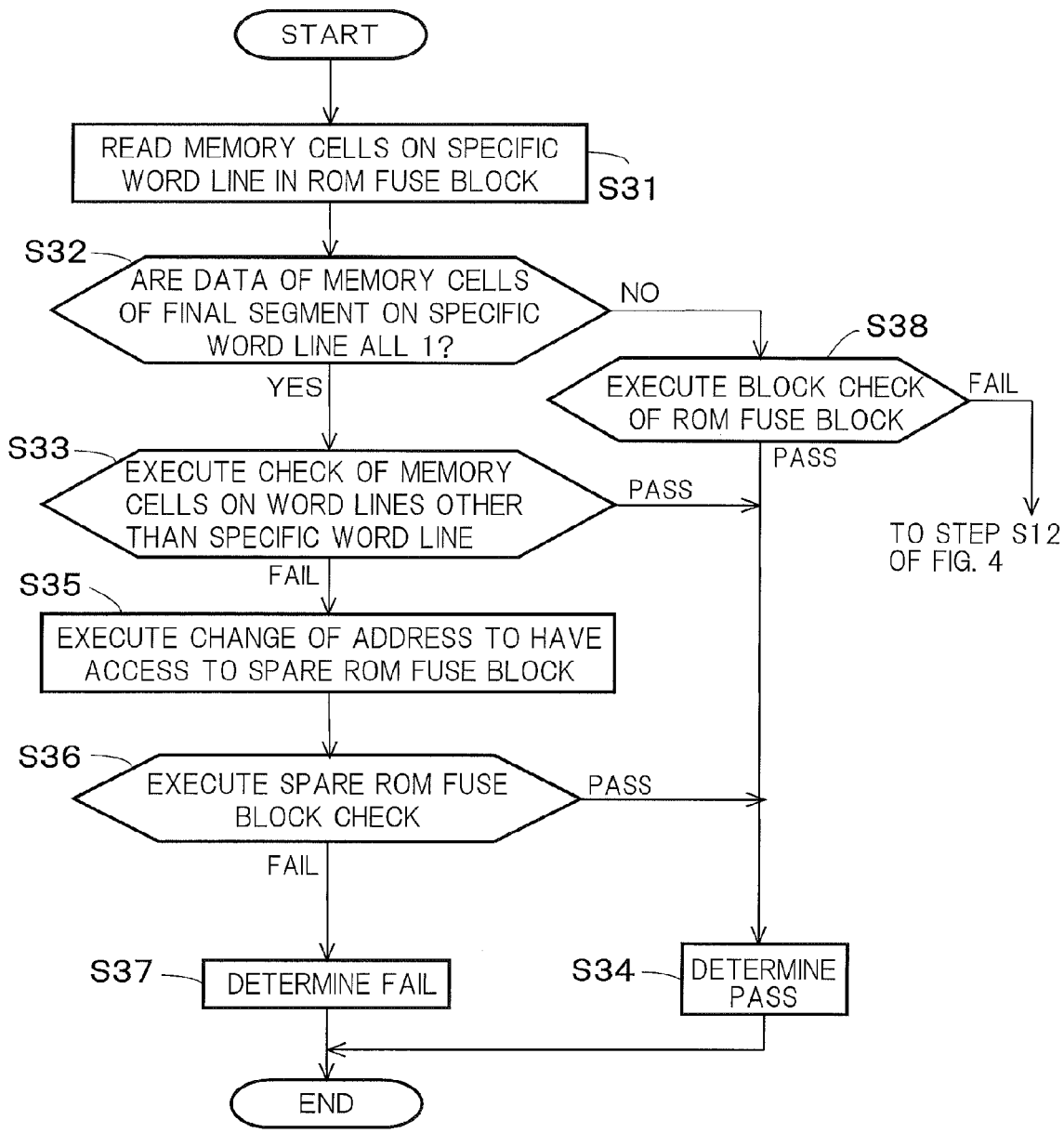
FIG. 6 is a flowchart illustrating a defect check process of a ROM FUSE block according to a third embodiment.

FIG. 6 is a flowchart illustrating a defect check process of the ROM FUSE block according to the third embodiment. First, data of memory cells on a specific word line in the ROM FUSE block is read (step S31).

Data of all memory cells of a non-used segment on the specific word line are all "1". Meanwhile, if "0" is initially written to all of the memory cells of the non-used segment on the specific word line in the ROM FUSE block on which a refresh operation is not executed, "0" is maintained in all of the memory cells.

Therefore, it is determined whether data of the memory cells of the non-used segment on the specific word line in the ROM FUSE block are all "1" (step S32: refresh determination unit or refresh determination circuitry). When the data of the memory cells are all "1", it is determined that the refresh operation of the ROM FUSE block is executed in the past, data of memory cells on a predetermined word line other than the specific word line in the ROM FUSE block is read, and it is determined whether there is a defect (step S33). Here, bad block information or bad column information is stored previously as complementary data in the ROM FUSE block, the complementary data is read, two kinds of data configuring the complementary data are compared, and it is determined whether there is the defect.

In step S33, when data read from the ROM FUSE block has been normally executed, it is determined that a check of the ROM FUSE block has passed in (step S34), and a process of FIG. 6 ends.

Meanwhile, when it is determined in step S33 that the ROM FUSE block is defective, the refresh operation of the ROM FUSE block is not executed and a change of an address to have access to a spare ROM FUSE block is executed (step S35). In addition, memory cells on a specific word line in the spare ROM FUSE block are read and it is checked whether the spare ROM FUSE block is defective (step S36). Here, similar to step S33, the complementary data is read and it is determined whether there is a defect. As a result, when it is determined that the spare ROM FUSE block is defective, it is determined that the check of the ROM FUSE block has failed in (step S37). As a result, the NAND-type flash memory including the ROM FUSE block is assumed as a defective product.

When it is determined in step S36 that the spare ROM FUSE block is not defective, it is determined that the check of the ROM FUSE block has passed in (step S34). In this case, the ROM FUSE block is not used and the defect information in the spare ROM FUSE block is used.

Meanwhile, in step S32, when the data of all of the memory cells of the non-used segment on the specific word line in the ROM FUSE block are all "0", it is determined that the refresh operation of the ROM FUSE block has not been executed and an existing block check is executed (step S38). In step S38, the complementary data of the memory cells on the specific word line in the ROM FUSE block is read and it is determined whether there is a defect.

When it is determined in step S38 that the ROM FUSE block is normal, it is assumed that the check of the ROM FUSE block has passed in (step S34). Meanwhile, when it is determined in step S38 that the ROM FUSE block is defective, the refresh process of steps S12 to S20 of the flowchart of FIG. 4 is executed.

As such, in the process of FIG. 6, it is confirmed whether the refresh operation is executed on the ROM FUSE block in the past. If the refresh operation is executed on the ROM FUSE block in the past, the spare ROM FUSE block is used without executing the refresh operation again, even though the ROM FUSE block becomes defective again. Meanwhile, if the refresh operation is not executed on the ROM FUSE block in the past, at the time of becoming defective, the refresh operation is executed on the ROM FUSE block, the defect information in the spare ROM FUSE block is written to the ROM FUSE block, and the ROM FUSE block is continuously used.

FIG. 7 is a timing diagram illustrating process timing of a power-on read operation after the ROM refresh operation when the process changes to steps S31, S32, S33, and S35 of FIG. 6. First, data is read from memory cells on a specific word line (for example, a word line WL15) in the ROM FUSE block (time t11). When the read data are all "1", it is determined that the refresh operation is executed on the ROM FUSE block in the past, the refresh operation of the ROM FUSE block is not executed gain, and data of memory cells on a predetermined word line other than the specific word line in the ROM FUSE block is read (time t12). In addition, the block check of the ROM FUSE block is executed on the basis of the read data. When it is determined that the ROM FUSE block is defective, data of memory cells on a specific word line (for example, a word line WL15) in the spare ROM FUSE block is read (time t13).

As such, in the third embodiment, the data of the memory cells on the specific word line in the ROM FUSE block is read and it can be accurately determined whether the refresh operation is executed on the ROM FUSE block in the past, according to whether the read data are all "1".

In addition, the refresh operation is not executed again on the ROM FUSE block on which the refresh operation is executed in the past. Therefore, a ROM FUSE block having low reliability can be prevented from being continuously used.

When it is determined that the ROM FUSE block on which the refresh operation is not executed in the past is defective, similar to the second embodiment, the refresh operation of the ROM FUSE block is executed. Therefore, a level of defectiveness of the ROM FUSE block can be reduced.

Fourth Embodiment

A fourth embodiment to be described below is characterized by a method of storing defect information in a ROM FUSE block.

Figure 8:
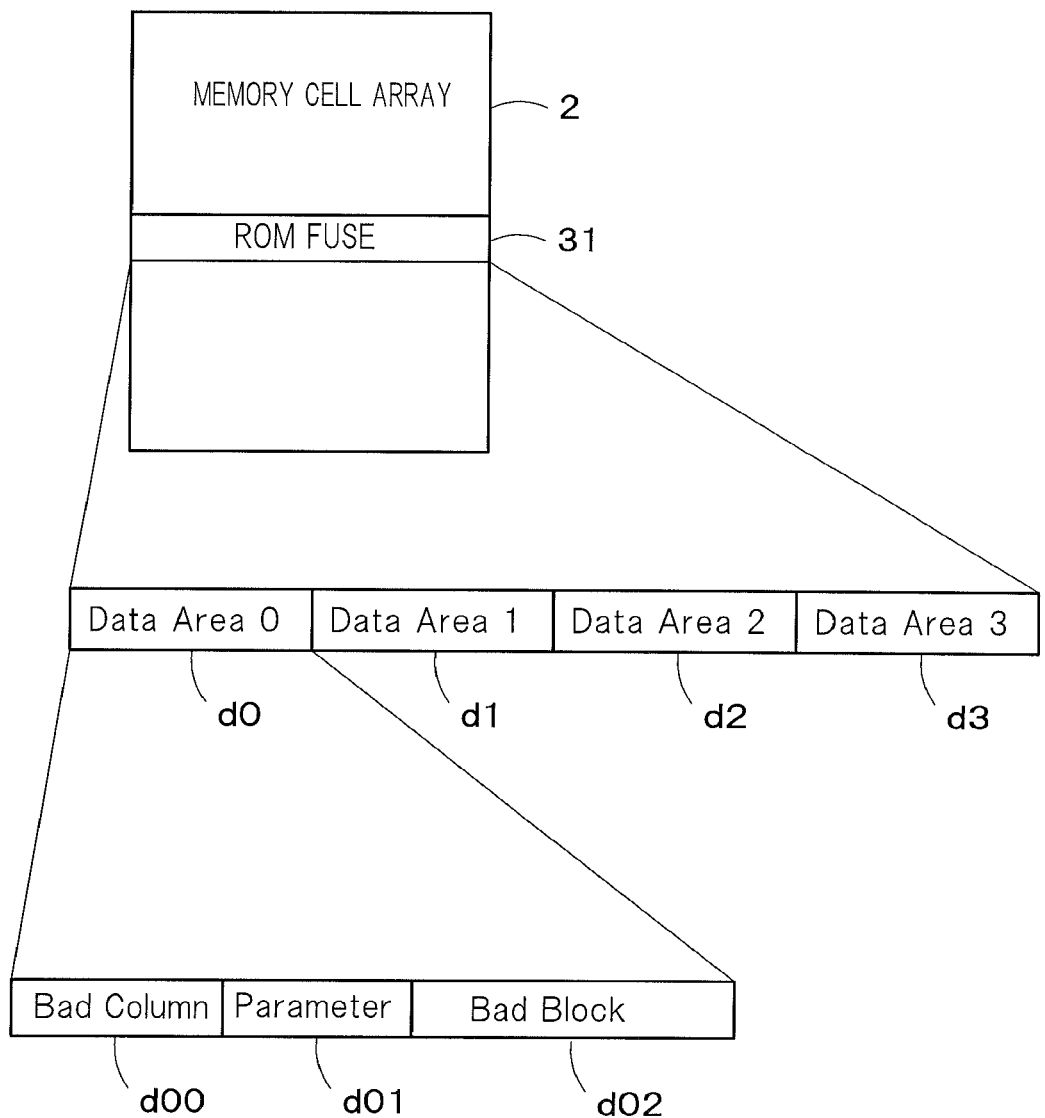
FIG. 8 is a diagram illustrating a memory map of a memory cell array 2 including a ROM FUSE block 31.

FIG. 8 is a diagram illustrating a memory map of a memory cell array 2 including a ROM FUSE block 31. As illustrated in FIG. 8, the ROM FUSE block 31 is one of a plurality of blocks provided in the memory cell array 2. The ROM FUSE block 31 is divided into four data areas d0 to d3. Information stored in the four data areas d0 to d3 are the same. The information stored in the individual data areas includes bad column information d00, parameter information d01, and bad block information d02. When it is determined that one data area is defective, the same type of information can be read from other data area.

FIG. 9A is a diagram illustrating a data configuration of the bad block information stored in each data area of the ROM FUSE block 31. In the bad block information of FIG. 9A, defect information of 8 blocks is stored in 4 bytes. More specifically, address information of 8 bits showing a quotient obtained by dividing a block address by 8 is stored in the first byte. Inversion data of the address information of the 8 bits of the first byte is stored in the second byte. Flag information showing whether each of the 8 blocks is defective is stored in one bit in the third byte. Inversion data of 8-bit data of the third byte is stored in the fourth byte.

In FIG. 9A, the quotient obtained by dividing the block address by 8 is represented as Block Add X and the 8-bit data including the flag information of the 8 bits showing whether each of the 8 blocks is defective is represented as Block IO.

FIG. 9B is a diagram illustrating a correspondence relation of each block in the memory cell array 2, the quotient Block Add X obtained by dividing the block address of each block by 8, and the 8-bit data Block IO showing whether each block is defective.

As known from FIGS. 9A and 9B, in this embodiment, the 8 block addresses are converted into one address information Block Add X, the flag information showing whether each block is defective is represented by one bit, and the flag information of the 8 blocks is stored as one byte in the ROM FUSE block 31. In addition, in this embodiment, when there is no defective block in the 8 blocks represented by Block Add X, information is not stored in the ROM FUSE block 31. As a result, defect information of a large amount of blocks can be stored in the ROM FUSE block 31.

The defect information stored in the ROM FUSE block 31 according to FIGS. 9A and 9B is latched by a latch circuit (defect information holding unit or defect information holding circuitry) 3a provided in a block selection circuit (not illustrated in the drawings) in a row decoder 3. The block selection circuit refers to the data latched by the latch circuit 3a, so that the block selection circuit selects whether or not to have access to each block.

Figure 10:
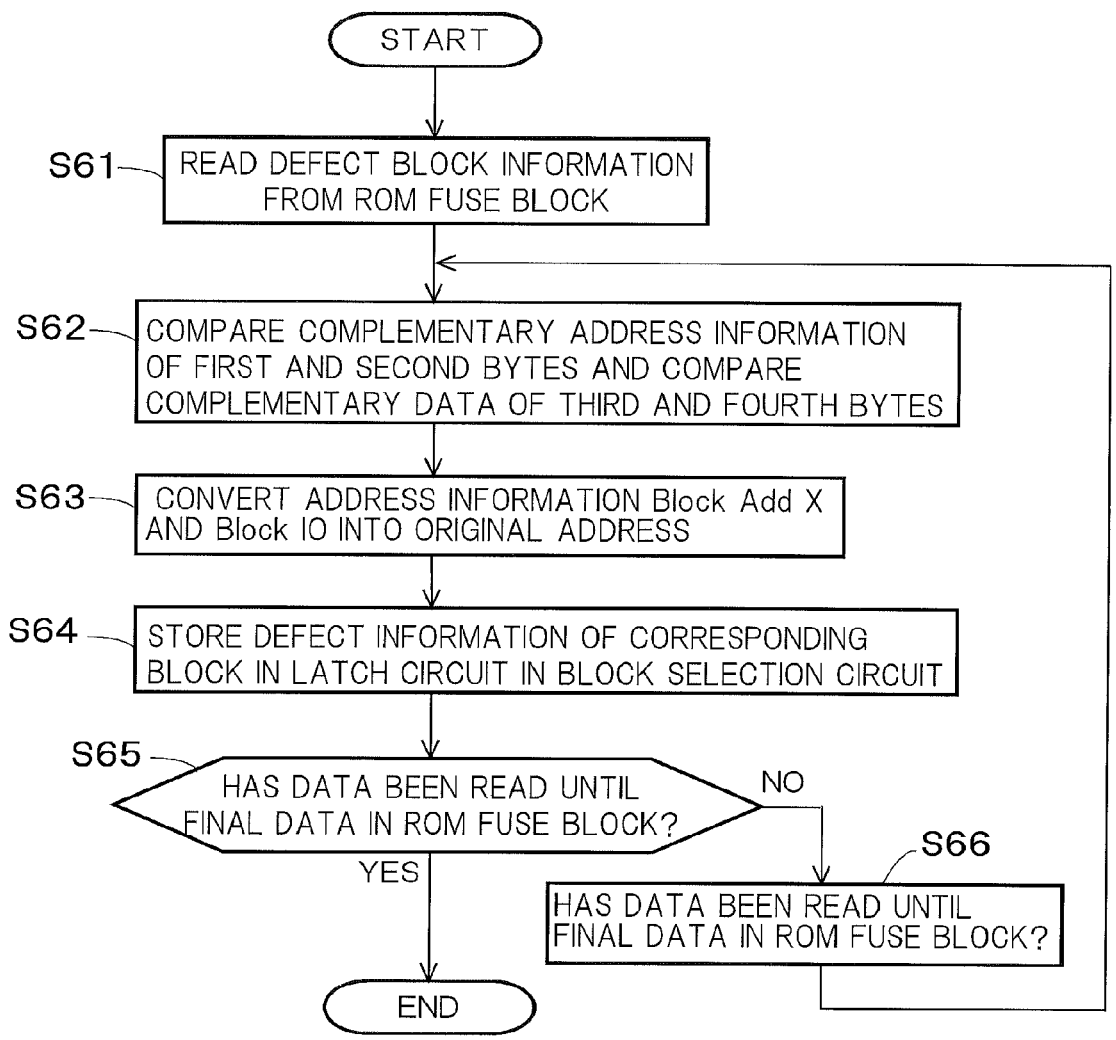
FIG. 10 is a flowchart illustrating an example of a process sequence to transfer defect block information.

FIG. 10 is a flowchart illustrating an example of a process sequence to transfer defective block information from the ROM FUSE block 31 to the latch circuit 3a in the block selection circuit. The flowchart is executed by a controller 8, for example. First, the defective block information is read from the ROM FUSE block 31 (step S61). The read defective block information is stored temporarily. Next, the address information Block Add X and the inversion data thereof stored in the first and second bytes of FIG. 9A are compared and the flag information Block IO and the inversion data thereof stored in the third and fourth bytes of FIG. 9A are compared (step S62).

When the comparison of step S62 has passed in, it is determined that there is no defect in the ROM FUSE block 31 and the address information Block Add X and Block IO are converted into an original block address (step S63: address conversion unit or address conversion circuitry). Defect information of a corresponding block is stored in the latch circuit in the block selection circuit corresponding to the block address converted by step S63 (step S64).

Next, it is determined whether data has been read until final data in the ROM FUSE block 31 (step S65). When non-read data exists, next 4-byte data in the ROM FUSE block 31 is read (step S66) and the process proceeds to step S62.

Figure 11:
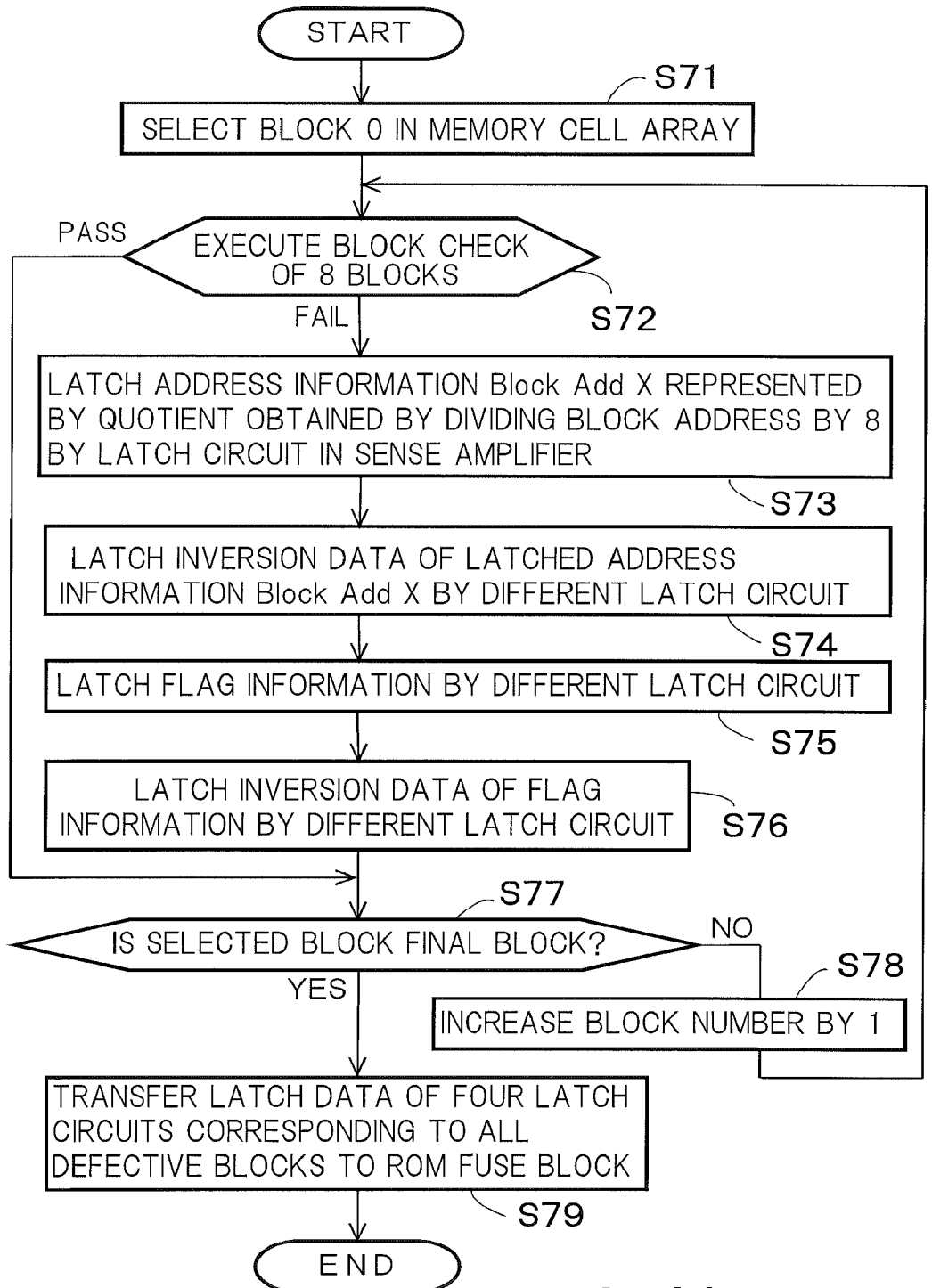
FIG. 11 is a flowchart illustrating an example of a process sequence to store defect information in the ROM FUSE block 31.

FIG. 11 is a flowchart illustrating an example of a process sequence to store (register) defect information in the ROM FUSE block 31 at the time of a test before a shipment. First, a block 0 in the memory cell array 2 is selected (step S71). In this embodiment, block addresses of 8 blocks in which at least one block is defective is stored in the ROM FUSE block 31 as one address information. For this reason, an existing block check is executed on the 8 blocks, sequentially from the block 0, and it is checked whether there is a defect in the blocks (step S72).

When it is determined that there is a defect in the selected block, the address information Block Add X represented by the quotient obtained by dividing the block address corresponding to the block by 8 is latched by a data latch circuit in a sense amplifier (step S73). Next, inversion data of the address information Block Add X latched by step S73 is latched by a data latch circuit different from the data latch circuit used in step S73 (step S74).

Next, flag information showing whether which of the 8 blocks is defective is held as 8-bit data in a data latch circuit different from the data latch circuits used in steps S73 and S74 (step S75). Next, inversion data of the data held by step S75 is held in a data latch circuit different from the data latch circuits used in steps S73 to S75 (step S76).

Next, it is determined whether the selected block is a final block of the 8 blocks stored collectively (step S77). When the selected block is not the final block, a block number is increased by 1 (step S78) and the processes after step S72 are repeated. When it is determined in step S77 that the selected block is the final block, the latch data of the 4 data latch circuits held by steps S73 to S76 are transferred as data corresponding to 4 column addresses to the ROM FUSE block 31, such that data of all defective blocks are collected and transferred to the ROM FUSE block 31 (step S79). When it is determined in the defect check of step S72 that there is no defect, the process of step S77 is executed. The above processes are executed on all blocks of the memory cell array 2.

As such, in the fourth embodiment, the quotient obtained by dividing each block address or each column address by 8 is set as the address and the data in which the defect information of each block or each column is represented by one bit is stored in the ROM FUSE block 31. Therefore, the defect information that can be stored in the ROM FUSE block 31 can be increased. In addition, in this embodiment, because information of a non-defective block or a non-defective column is not stored in the ROM FUSE block 31, storage areas of the ROM FUSE block 31 can be effectively used. Therefore, when the power-on read operation is executed, read of the defect information from the ROM FUSE block 31 can be executed at a high speed. According to this embodiment, the defect information of the 8 blocks can be stored in only 4 bytes and defect information of blocks of an amount 8 times larger than an amount in a comparative example in which defect information of one block is stored in 4 bytes can be stored.

The data configuration of the ROM FUSE block 31 according to the fourth embodiment can be applied to the ROM FUSE blocks 31 according to the first to third embodiments. As a result, even in the first to third embodiments, a large amount of defect information can be stored in the ROM FUSE block 31 and it is possible to correspond to an increase in the capacity of the NAND-type flash memory.

In the embodiments described above, the example of the case in which the present invention is applied to the NAND-type flash memory has been described. However, the present invention can be applied to various non-volatile semiconductor storage devices having a ROM FUSE block, such as a NOR-type flash memory, an MRAM, and a ReRAM.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory cell array that has a plurality of memory cells, a plurality of word lines connected to at least some memory cells of the plurality of memory cells, a plurality of bit lines connected to at least some memory cells of the plurality of memory cells, and a plurality of blocks including a group of at least some memory cells of the plurality of memory cells;
a defect information storage block that is at least one of the plurality of blocks and stores defect information in the memory cell array;
a first defect detection circuitry that reads data of at least some memory cells in the defect information storage block, verifies the data, and determines whether there is a defect in the defect information storage block;
a second defect detection circuitry that, when it is determined by the first defect detection circuitry that there is the defect, changes a read voltage level for reading the data of the memory cells, rereads data of at least some memory cells in the defect information storage block, verifies the data, and determines whether there is the defect in the defect information storage block; and
a defect determination circuitry that, when it is determined by the second defect detection circuitry that there is the defect, determines the defect information storage block as a defective block.

2. The semiconductor storage device according to claim 1, wherein the first and second defect detection circuitries determine whether there is the defect in the defect information storage block, whenever the semiconductor storage device executes a power-on read operation.

3. The semiconductor storage device according to claim 1, wherein at least one of the first and second defect detection circuitries determines that there is the defect, when the number of inversions of storage data of at least some memory cells on a specific word line in the defect information storage block is more than a predetermined value.

4. The semiconductor storage device according to claim 1, wherein at least one of the first and second defect detection circuitries writes specific data given to a specific bit line in the defect information storage block to the memory cells connected to the specific bit line, compares data read from the memory cells and the specific data, and determines whether there is the defect.

5. The semiconductor storage device according to claim 1, wherein at least one of the first and second defect detection circuitries writes complementary data to at least some memory cells on a specific word line in the defect information storage block, reads the complementary data, compares the complementary data, and determines whether there is the defect.

6. The semiconductor storage device according to claim 1, further comprising:
a third defect detection circuitry that, when it is determined that there is no defect, by at least one of the first and second defect detection circuitries, writes complementary data to at least a part of the defect information storage block, reads the written complementary data, compares the complementary data, and determines whether there is the defect in the defect information storage block.

7. The semiconductor storage device according to claim 1, wherein the defect information storage block associates address information represented by quotients obtained by dividing addresses to designate individual blocks or individual columns obtained by dividing the memory cell array in a block unit or a column unit by n (n is an integer of 2 or more) and n-bit data in which defect information of each of n blocks or columns is set as one bit and stores an association result.

8. The semiconductor storage device according to claim 7, wherein the defect information storage block associates the address information, inversion data of the address information, the n-bit data, and inversion data of the n-bit data and stores an association result.

9. The semiconductor storage device according to claim 7, further comprising:
a defect information holding circuitry that reads the defect information stored in the defect information storage block and holds the defect information; and
an address conversion circuitry that converts the addresses to have access to the defect information storage block into addresses to have access to the defect information holding circuitry,
wherein the defect information holding circuitry has a plurality of latch circuits that store the defect information of the block unit or the column unit stored in the defect information storage block individually in association with the addresses converted by the address conversion circuitry.

10. A semiconductor storage device comprising:
a memory cell array that has a plurality of memory cells, a plurality of word lines connected to at least some memory cells of the plurality of memory cells, a plurality of bit lines connected to at least some memory cells of the plurality of memory cells, and a plurality of blocks including a group of at least some memory cells of the plurality of memory cells;
a defect information storage block that is at least one of the plurality of blocks and stores defect information in the memory cell array;
a spare storage block that stores the same defect information as the defect information storage block;
a first defect detection circuitry that determines whether there is a defect in the defect information storage block;
a data erasure circuitry that, when it is detected by the first defect detection circuitry that there is the defect in the defect information storage block, erases storage data of all memory cells in the defect information storage block;
a temporary holding circuitry that reads the defect information stored in the spare storage block and holds the defect information temporarily; and
a defect information write circuitry that writes the defect information held in the temporary holding circuitry to the defect information storage block after erasure by the data erasure circuitry.

11. The semiconductor storage device according to claim 10, further comprising:
a second defect detection circuitry that, when it is detected that there is the defect in the defect information storage block, detects whether there is the defect in the spare storage block,
wherein the data erasure circuitry erases the storage data of the memory cells in the defect information storage block, when it is detected by the first defect detection circuitry that there is the defect in the defect information storage block and it is detected by the second defect detection circuitry that there is no defect in the spare storage block.

12. The semiconductor storage device according to claim 11, wherein the first and second defect detection circuitries determine whether there is the defect, whenever the semiconductor storage device executes a power-on read operation.

13. The semiconductor storage device according to claim 10, wherein the first defect detection circuitry detects whether there is the defect in the defect information storage block, on the basis of a read result of data of the memory cells on a specific word line in the defect information storage block, and
the defect information write circuitry writes the defect information held in the temporary holding circuitry to the memory cells on the word lines other than the specific word line where the defect has been detected by the first defect detection circuitry, in the defect information storage block.

14. The semiconductor storage device according to claim 11, further comprising:
a defect determination circuitry that determines that the semiconductor storage device is defective, when it is determined by the second defect detection circuitry that there is the defect.

15. The semiconductor storage device according to claim 10, wherein the defect information storage block associates address information represented by quotients obtained by dividing addresses to designate individual blocks or individual columns obtained by dividing the memory cell array in a block unit or a column unit by n (n is an integer of 2 or more) and n-bit data in which defect information of each of n blocks or columns is set as one bit and stores an association result.

16. The semiconductor storage device according to claim 15, wherein the defect information storage block associates the address information, inversion data of the address information, the n-bit data, and inversion data of the n-bit data and stores an association result.

17. The semiconductor storage device according to claim 15, further comprising:
a defect information holding circuitry that reads the defect information stored in the defect information storage block and holds the defect information; and
an address conversion circuitry that converts the addresses to have access to the defect information storage block into addresses to have access to the defect information holding circuitry,
wherein the defect information holding circuitry has a plurality of latch circuits that store the defect information of the block unit or the column unit stored in the defect information storage block individually in association with the addresses converted by the address conversion circuitry.

18. A semiconductor storage device comprising:
a memory cell array that has a plurality of memory cells, a plurality of word lines connected to at least some memory cells of the plurality of memory cells, a plurality of bit lines connected to at least some memory cells of the plurality of memory cells, and a plurality of blocks including a group of at least some memory cells of the plurality of memory cells;
a defect information storage block that is at least one of the plurality of blocks and stores defect information in the memory cell array;
a spare storage block that stores the same defect information as the defect information storage block;
a first defect detection circuitry that determines whether there is a defect in the defect information storage block;
a refresh process circuitry that, when it is detected by the first defect detection circuitry that there is the defect in the defect information storage block, executes a refresh operation in which the defect information stored in the spare storage block is rewritten to the defect information storage block after storage data of the memory cells in the defect information storage block is erased; and a refresh history information storage that stores refresh history information including information showing whether the refresh operation has been executed.

19. The semiconductor storage device according to claim 18, further comprising:

a command process circuitry reads the refresh history information stored in the refresh history information storage, when a specific command is issued.

20. The semiconductor storage device according to claim 18, further comprising:

a refresh determination circuitry writes data of logic different from logic of the erasure data to some memory cells in the memory cell array before the refresh process circuitry executes a first refresh operation of the defect information storage block and determines whether the refresh operation has been executed, according to whether some memory cells have the same logic as the logic of the erasure data.

* * * * *